(12) United States Patent
Chung et al.

(10) Patent No.: US 8,854,104 B2
(45) Date of Patent: Oct. 7, 2014

(54) VOLTAGE LEVEL SHIFTER

(71) Applicants: Tao Wen Chung, San Jose, CA (US);
Chan-Hong Chern, Palo Alto, CA (US);
Tsung-Ching (Jim) Huang, San Jose,
CA (US); Chih-Chang Lin, San Jose,
CA (US); Ming-Chieh Huang, San Jose,
CA (US)

(72) Inventors: Tao Wen Chung, San Jose, CA (US);
Chan-Hong Chern, Palo Alto, CA (US);
Tsung-Ching (Jim) Huang, San Jose,
CA (US); Chih-Chang Lin, San Jose,
CA (US); Ming-Chieh Huang, San Jose,
CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/793,681

(22) Filed: Mar. 11, 2013

(65) Prior Publication Data

US 2014/0184299 A1    Jul. 3, 2014

Related U.S. Application Data

(60) Provisional application No. 61/747,728, filed on Dec. 31, 2012.

(51) Int. Cl.
*H03L 5/00* (2006.01)

(52) U.S. Cl.
USPC .................. 327/333; 326/80; 326/81

(58) Field of Classification Search
USPC ........................ 327/333; 326/80, 81
See application file for complete search history.

(56) References Cited

U.S. PATENT DOCUMENTS

| | | | | |
|---|---|---|---|---|
| 5,969,542 | A * | 10/1999 | Maley et al. | 326/81 |
| 7,199,617 | B1 * | 4/2007 | Schrom et al. | 326/86 |
| 8,149,017 | B2 * | 4/2012 | Knierim | 326/80 |
| 8,324,955 | B2 * | 12/2012 | Roth et al. | 327/333 |

* cited by examiner

*Primary Examiner* — Kenneth B. Wells
(74) *Attorney, Agent, or Firm* — Lowe Hauptman & Ham, LLP

(57) ABSTRACT

A circuit includes a first capacitive device and a first latch. The first capacitive device includes a first end configured to receive a first input signal and a second end coupled with the first latch. The first latch includes a first transistor and a second transistor that are of a first type. A first terminal of the first transistor and a first terminal of the second transistor are each configured to receive a first voltage value. A second terminal of the first transistor is coupled with a third terminal of the second transistor. A third terminal of the first transistor is coupled with a second terminal of the second transistor and with the second end of the capacitive device, and is configured to provide an output voltage for the first latch.

20 Claims, 3 Drawing Sheets

VOLTAGE LEVEL SHIFTER

CROSS-REFERENCE TO RELATED APPLICATION

The present application claims the priority of U.S. Provisional Application No. 61/747,728, filed Dec. 31, 2012, the disclosure of which is incorporated herein by reference in its entirety.

FIELD

The present disclosure is related to a voltage level shifter.

BACKGROUND

Existing voltage level shifters have various shortcomings. For example, in one approach, the level shifter shifts a voltage level of a high logical value of a signal, but does not shift a voltage level of a low logical value. In some situations, transistors in the level shifter suffer from an electrical over stress (EOS) and cause a time dependent dielectric breakdown (TDDB). To improve the situations, a bias circuit is added to provide a constant bias to the level shifter. The additional bias circuit is not favored, however. Further, EOS and TDDB issues remain in the level shifter in a different form.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
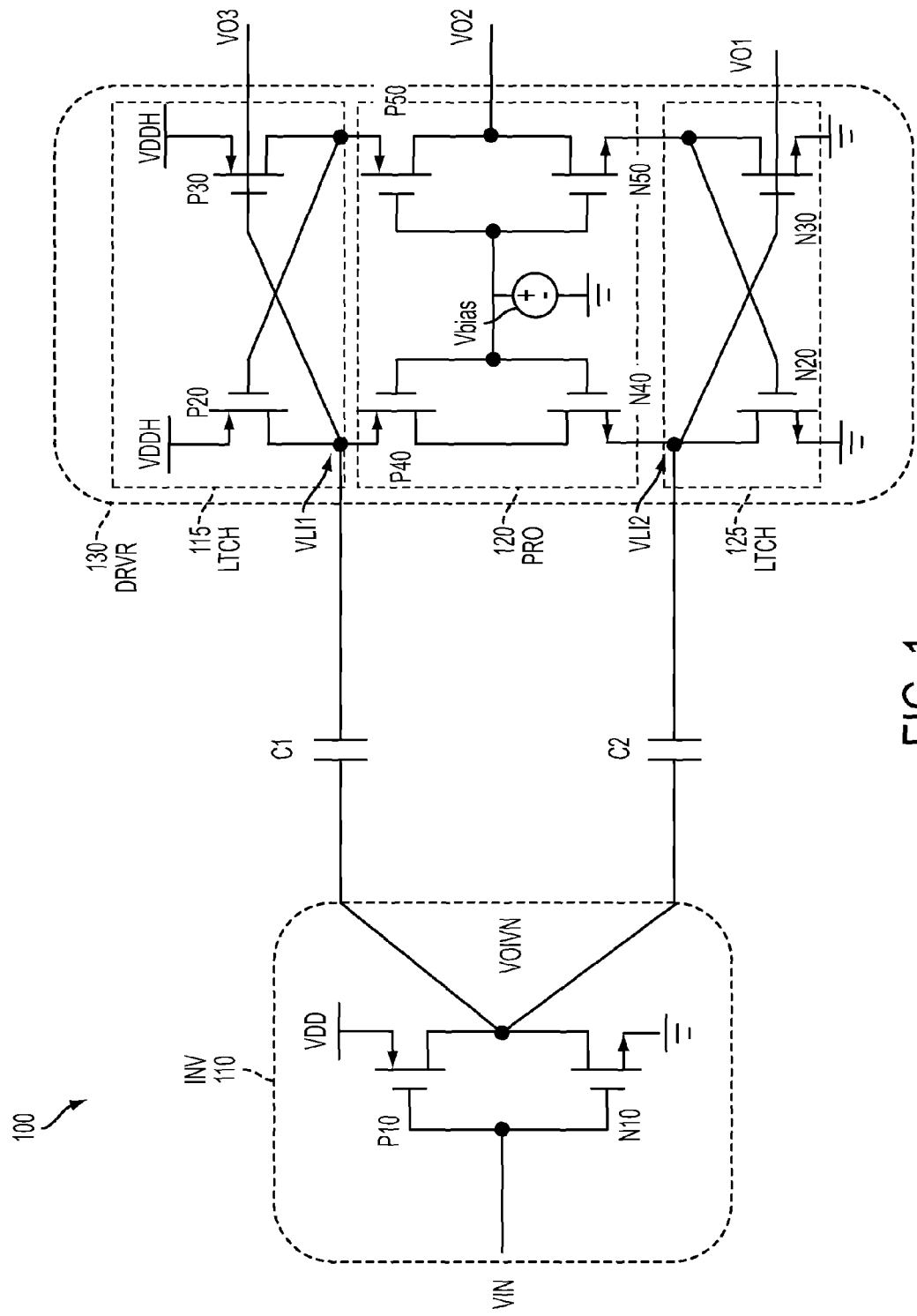
FIG. 1 is a diagram of a voltage level shifter, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. In some embodiments, a voltage level shifter uses core transistors and generates voltages for use by both core transistors and input-output (IO) transistors. The voltage level shifter does not generate static currents.

For illustration, a circuit that performs a particular function is called a principle circuit. In some embodiments, the principle circuit includes a core portion and an IO portion. The core portion uses core transistors while the IO portion uses IO transistors. IO transistors in the IO portion are used as an interface between circuits in the core portion and circuits outside of the principle circuit. In some embodiments, a gate oxide of an IO transistor is thicker than a gate oxide of a core transistor.

In some embodiments, in a VDD domain, signals switch between a reference supply voltage VSS and a supply voltage VDD. Further, in some embodiments, reference supply voltage VSS is 0 V or ground. In contrast, in a VDDH domain, signals switch between voltage VDD and a high voltage VDDH higher than voltage VDD or between ground and high voltage VDDH. In some embodiments, voltage VDD is for use by core transistors, and is about 0.8 V, while voltage VDDH is for used by IO transistors, and is about 1.6 V. Other values of supply voltages VDD and/or VDDH are within the scope of various embodiments.

For simplicity, a source terminal, a gate terminal, and a drain terminal of a transistor are called a source, a gate, and a drain, respectively.

Voltage Level Shifter

FIG. 1 is a diagram of a level shifter 100, in accordance with some embodiments. For illustration, voltages VSDP20, VSDP30, VSDP40, and VSDP50 are each a voltage drop across a source and a drain of PMOS transistors P20, P30, P40, and P50, respectively. Further, voltages VGSP20, VGSP30, VGSP40, and VGSP50 are each a voltage drop across a gate and the source of PMOS transistors P20, P30, P40, and P50, respectively. Similarly, voltages VDSN20, VDSN30, VDSN40, and VDSN50 are each a voltage drop across a drain and a source of NMOS transistors N20, N30, N40, and N50, respectively. Further, voltages VGSN20, VGSN30, VGSN40, and VSGN50 are each a voltage drop across a gate and the source of NMOS transistors N20, N30, N40, and N50, respectively.

Level shifter 100 receives an input voltage VIN in the VDD domain, and generates output voltages VO1, VO2, and VO3 in the VDD, VDDH, and VDDH domains, respectively. For example, voltage VIN switches between 0 V or ground and supply voltage VDD. Voltage VO1 switches between 0 V and supply voltage VDD. Output voltage VO2 switches between 0 V and supply voltage VDDH, and output voltage VO3 switches between supply voltage VDD and supply voltage VDDH. For illustrations, voltages VO1, VO2, and VO3 are on nodes NO1, NO2, and NO3, respectively. Nodes NO1, NO2, and NO3 are not labeled.

An inverter INV 110 is formed by a PMOS transistor P10 and an NMOS transistor N10. A source of PMOS transistor P10 receives supply voltage VDD. A drain of PMOS transistor P10 is coupled with a drain of NMOS transistor N10, and provides a voltage VOIVN, which is a logical inverse of voltage VIN. Inverter INV 110 functions in the VDD domain because both input voltage VIN and output voltage VOINV switch between 0 V and voltage VDD. Inverter INV 110 is used for illustration. Other circuits providing voltage VOINV in the VDD domain are within the scope of various embodiments.

A capacitor C1 provides a capacitive coupling of voltage VOINV and a voltage VLI1 on a node NLI1 (not labeled). For example, capacitor C1 receives voltage VOIVN switching between 0 V and VDD. Based on operations of capacitor C1, voltage VDD at a source of PMOS transistor P10, and voltage VDDH at a source of PMOS transistor P20, capacitor C1 generates voltage VLI1 switching between voltage VDD and voltage VDDH. In some embodiments, a value of capacitor C1 is selected to be much greater than capacitance seen at node NLI1. For example, a value of capacitor C1 is about ten times a value of the capacitance seen at node NLI1.

A capacitor C2 provides a capacitive coupling of voltage VOINV and a voltage VLI2 on a node NLI2 (not labeled). For example, capacitor C2 receives voltage VOIVN switching between 0 V and VDD. Based on operations of capacitor C2, voltage VDD at the source of PMOS transistor P10, and 0 V at a source of NMOS transistor N20, capacitor C2 generates voltage VLI2 switching between 0 V and VDD. In some embodiments, a value of capacitor C2 is selected to be much greater than a capacitance seen at the source of transistor N30. For example, a value of capacitor C2 is about ten times a value of the capacitance seen at the source of transistor N30.

A driver circuit DRVR 130 includes a first latch LTCH 115, a protection circuit 120, and a second latch LTCH 125. With reference to first latch LTCH 115, sources of transistors P20 and P30 receive voltage VDDH. A drain of transistor P20 is coupled with a gate of transistor P30, and functions as node NLI1 and node NO3 having voltage VO3. A drain of transistor P30 is coupled with a gate of transistor P20. By operations of latch LTCH 115, when transistor P20 is on, transistor P30 is off, and vice versa. For example, when voltage VLI1, which is also voltage VO3, is at voltage VDD, voltage VGSP30 is at VDD−VDDH, and transistor P30 is turned on. As a result, the drain of transistor P30 is pulled to voltage VDDH at the source of transistor P30. The gate of transistor P20 coupled with the drain of transistor P30 is therefore also at voltage VDDH. As a result, voltage VGSP20 is at VDDH−VDDH or 0 V. Transistor P20 is therefore off. Similarly, when the source of transistor P30 is at voltage VDD, for example, transistor P20 is on, and transistor P30 is off in a manner similar to transistor P30 being on and transistor P20 being off.

With reference to second latch LTCH 125, sources of transistors N20 and N30 receive reference supply voltage VSS (not labeled) or ground. A drain of transistor N20 is coupled with a gate of transistor N30, and functions as node NLI2 and node NO1 having a voltage VO1. A drain of transistor N30 is coupled with a gate of transistor N20. By operations of latch LTCH 125, when transistor N20 is on, transistor N30 is off, and vice versa. For example, when voltage VLI2 is at voltage VDD, voltage VO1 is also at voltage VDD. Voltage VGSN30 is therefore at voltage VDD, and transistor N30 is turned on. As a result, the drain of transistor N30 is pulled to 0 V at the source of transistor N30. The gate of transistor N20 coupled with the drain of transistor N30 is therefore also 0 V. As a result, voltage VGSN20 is 0 V. Transistor N20 is therefore off. Similarly, when a drain of transistor N30 is at voltage VDD, transistor N20 is on, and transistor N30 is off in a similar manner as transistor N30 being on and transistor N20 being off.

In some embodiments, when voltage VLI2 is at voltage VDD, voltage VLI2 continues to be substantially at voltage VDD even if node NLI2 is electrically disconnected from capacitor C2, such as in a direct current (DC) situation. For example, even when transistors P40 and N40 are off, there is a leakage current through transistors P40 and N40. In such a situation, voltage VDDH at the source of transistor P20, resistors of transistors P20, P40, N40, and N20 function as a voltage divider to keep voltage VLI2 substantially at voltage VDD.

Protection circuit PRO 120 includes PMOS transistors P40, P50 and NMOS transistors N40, N50. Gates of transistors P40, P50, N40, and N50 are coupled together, and receive a voltage Vbias. Based on voltage Vbias, voltage VLI1, and voltage VLI2, transistors P40 and N40 are turned on and off such that each of voltage VSDP20 and voltage VDSN20 does not exceed a corresponding maximum predetermined voltage value. As a result, transistors P20 and N20 are protected from an electrical breakdown. For example, without protection circuit PRO 120, when voltage VSDP20 reaches beyond a maximum allowable voltage, transistor P20 is damaged. Similarly, when voltage VDSN20 reaches beyond a maximum allowable voltage value, transistor N20 is damaged. Further, based on voltage Vbias, voltage VO3, and voltage VO1, transistors P50 and N50 are turned on and off such that each of voltage VSDP30 and voltage VDSN30 does not exceed a corresponding predetermined maximum voltage value. As a result, transistors P30 and N30 are protected from an electrical breakdown.

In some embodiments, a minimum value of voltage Vbias is determined to be VDSN20+VGSN40, and a maximum value of voltage Vbias is determined to be VHHD−VSDP20−VGSP40. Further, simulation is performed within the minimum value and the maximum value of voltage Vbias to select a value for voltage Vbias such that transistors P20, N20, P30 and N30 do not breakdown. In some embodiments, voltage Vbias is set at VDD or ½ VDDH.

When at least one of transistors P40 and N40 is off, PMOS transistor P20 is electrically disconnected from NMOS transistor N20. Effectively, PMOS transistor P20 is electrically disconnected from voltage VSS at the source of transistor N20. Because the source of transistor P20 is VDDH, and the minimum value of voltage VLI1 is voltage VDD, voltage VSDP20 is at most VDDH−VDD, which, in some embodiments, is less than a maximum value predetermined for voltage VSDP20. As a result, transistor P20 is protected. Similarly, NMOS transistor N20 is electrically disconnected from high voltage VDDH at the source of PMOS transistor P20. Because the maximum value of voltage VLI2 at the drain of transistor N20 is voltage VDD, and the source of transistor N20 is 0 V, voltage VDSN20 is at most VDD, which, in some embodiments, is less than a maximum value predetermined for voltage VDSN20. As a result, transistor N20 is protected.

In contrast, when both transistors P40 and N40 are turned on, $$VSDP20=VDDH-(VSDP40+VDSN40+VDSN20), \text{ and}$$

$$VDSN20=VDDH-(VSDP20+VSDP40+VDSN40)$$

In some embodiments, transistors P40 and N40 are selected such that VDDH−(VSDP40+VDSN40+VDSN20) is less than the maximum value predetermined for voltage VSDP20 and VDDH−(VSDP20+VSDP40+VDSN40) is less than the maximum value predetermined for voltage VDSN20. As a result, both transistors P20 and N20 are protected.

Circuit PRO 120 is used for illustration. Other circuits functioning to protect transistors P20 and N20 are within the scope of various embodiments. For example, in some embodiments, one or a plurality of diodes connected in series is used in place of transistors P40 and N40. Based on a predetermined maximum value for voltage VSDP20, a predetermined maximum value for voltage VDSN20, the voltage drop across each diode, a number of diodes is selected to protect transistors P20 and N20. In other words, the number of diodes is selected such that voltage VSDP20 and voltage VDSN20 are each less than a corresponding maximum predetermined voltage value. In some embodiments, a transistor configured as a diode is used in place of a diode. In some embodiments, one or a plurality of diodes connected in series is also used in place of transistors P50 and N50 to protect transistors P30 and N30 in a manner similar to protecting transistors P20 and N20.

In some embodiments, transistors P30, P50, N50, and N30 are configured such that both transistors P30 and P50 are on or off at the same time. For example, when voltage VLI1 at the gate of transistor P30 is at voltage VDD, transistor P30 is on. As a result, the drain of transistor P30 coupled with the source of transistor P50 are at voltage VDDH at the source of transistor P30. As a result, voltage VGSP50 is VDD−VDDH, and transistor P50 is on. Effectively, both transistors P30 and P50 are on at the same time. In contrast, when voltage VLI1 is at voltage VDDH, transistor P30 is off, and causes transistor P50 to function as an open circuit or to be turned off. Effectively, both transistors P30 and P50 are off at the same time.

Similarly, in some embodiments, both transistors N50 and N30 are on or off at the same time. For example, when voltage VLI2 is at voltage VDD, transistor N30 is turned on. The drain of transistor N30 coupled with the source of transistor N50 is at 0 V at the source of transistor N30. Further, voltage VGSN50 is VDD, and transistor N50 is therefore on. Effectively, both transistors N50 and N30 are on at the same time. In contrast, when voltage VLI2 is 0 V, transistor N30 is turned off, and causes transistor N50 to function as an open circuit or to be turned off. Effectively, both transistors N50 and N30 are off at the same time.

Further, when PMOS transistors P30 and P50 are on, NMOS transistors N50 and N30 are off, and vice versa. For example, when voltage VLI1 is at voltage VDD, voltage VLI2 is at 0 V. Because voltage VLI1 is at voltage VDD, transistor P30 is on. Because transistor P30 is on, transistor P50 is also on as explained above. In contrast, because voltage VLI2 is at 0 V, transistor N30 is off. Because transistor N30 is off, transistor N50 is also off as explained above. Effectively, when both transistors P30 and P50 are on, both transistors N50 and N30 are off. In contrast, when voltage VLI1 is at voltage VDDH, voltage VLI2 is at voltage VDD. Because voltage VLI1 is at voltage VDDH, transistor P30 is off. Because transistor P30 is off, transistor P50 is also off as explained above. In contrast, because voltage VLI2 is at voltage VDD, transistor N30 is on. Because transistor N30 is on, transistor N50 is also on as explained above. Effectively, when both transistors P30 and P50 are off, both transistors N50 and N30 are on.

When PMOS transistors P30 and P50 are on and NMOS transistors N50 and N30 are off, by operations of PMOS transistors P30 and P50, voltage VO2 is substantially the same as voltage VDDH at the source of PMOS transistor P30. In contrast, when NMOS transistors N30 and N50 are on and PMOS transistors P50 and P30 are off, by operations of NMOS transistors N50 and N30, voltage VO2 is substantially the same as voltage VSS or ground at the source of NMOS transistor N30. Effectively, voltage VO2 switches between voltage VDDH at the source of PMOS transistor P30 and 0 V at the source of NMOS transistor N30.

Applications of Circuit 100

Figure 2:
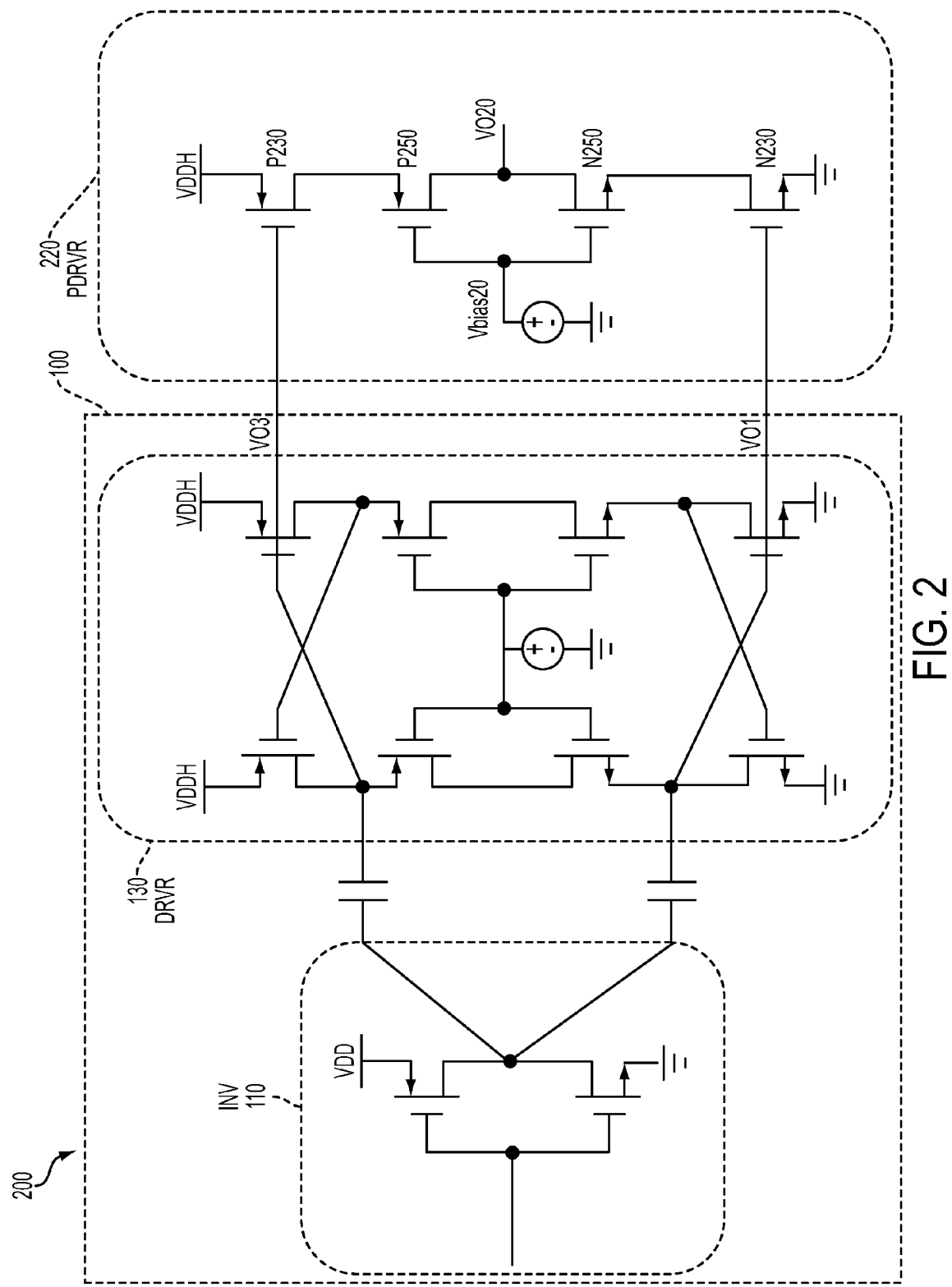
FIGS. 2 and 3 are diagrams of circuits that use the voltage level shifter in FIG. 1, in accordance with some embodiments.

FIG. 2 is a diagram of a circuit 200, in accordance with some embodiments. Circuit 200 uses circuit 100 in FIG. 1 to drive a post driver circuit PDRVR 220. For simplicity, various details of circuit 100 are not labeled.

In the context of circuit 200, driver DRVR 130 of circuit 100 is called a pre-driver. Post driver PDRVR 220 is driven by pre-driver DRVR 130 of circuit 100.

Post driver PDRVR 220 includes a PMOS transistor P230, a PMOS transistor P250, an NMOS transistor N250, and an NMOS transistor N230, which correspond to PMOS transistor P30, PMOS transistor P50, NMOS transistor N50, and NMOS transistor N30 of FIG. 1, respectively. For example, a source of transistor P230 receives voltage VDDH. A gate of transistor P230 receives voltage VO3 of circuit 100. A drain of transistor P230 is coupled with a source of transistor P250. A gate of transistor P250 is coupled with a gate of transistor N250, and receives a bias voltage Vbias20. A drain of transistor P250 is coupled with a drain of transistor N250, and provides an output voltage VO20 for circuit 200. A source of transistor N250 is coupled with a drain of transistor N230. A gate of transistor N230 receives voltage VO1 of circuit 100. A source of transistor N230 receives voltage VSS or ground. In some embodiments, voltage Vbias20 is set to VDD or ½ VHHD.

In some embodiments, sizes of transistors in post driver PDRVR 220 are larger than sizes of transistors in driver DRVR 130, and are selected based on a load of circuit 200 that is coupled with a node NO20 (not labeled) having voltage VO20. Other sizes of post driver PDRVR 220 are within the scope of various embodiments.

Similar to transistors P30, P50, N50, and N30 in circuit 100, transistors P250 and N250 are to protect transistors P230 and N230 from an electrical breakdown. Transistors P250 and N250 are thus form a protection circuit. In some embodiments, both PMOS transistors P230 and P250 are on or off at the same time, and both transistors NMOS N250 and N230 are on or off at the same time. Additionally, when PMOS transistors P230 and P250 are on, NMOS transistors N250 and N230 are off, and vice versa. Effectively, voltage VO20 switches between 0 V and voltage VDDH in the same manner as voltage VO2 of circuit 100 switching between 0 V and voltage VDDH.

Figure 3:
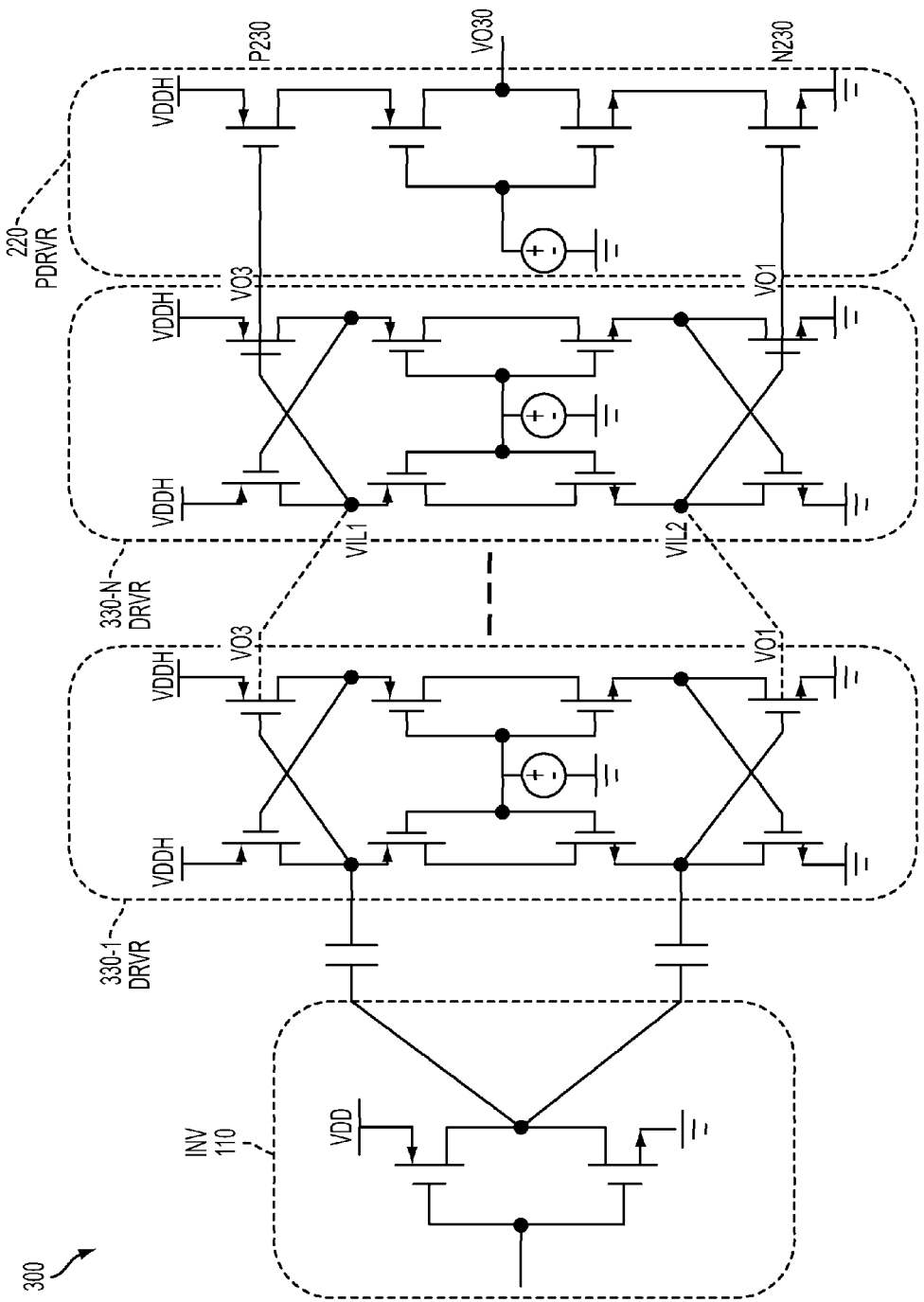

FIG. 3 is a diagram of a circuit 300, in accordance with some embodiments. Circuit 300 includes a predetermined number N of pre-drivers 330-1 to 330-N. For simplicity, each of pre-driver DRVR 330-1 to DRVR 330-N is called a pre-driver DRVR 330. Compared with circuit 200, circuit 300 includes more than one pre-driver DRVR 330 while circuit 200 includes one pre-driver 130.

For simplicity, various circuit elements of inverter INV 110, of each pre-driver DRVR 330, and of post driver PDRVR 220 are not labeled.

Each pre-driver DRVR 330 drives another pre-driver DRVR 330 or drives post driver PDRVR 220. For example, pre-driver DRVR 330-1 drives pre-driver DRVR 330-2, pre-driver DRVR 330-2 drives pre-driver DRVR 330-3, pre-driver DRVR 330-3 drives pre-driver DRVR 330-4, etc., and pre-driver DRVR 330-N drives post driver PDRVR 220.

In some embodiments, node NO3 having voltage VO3 of a first pre-driver DRVR 330 is coupled with node NIL1 having voltage VIL1 of a second pre-driver DRVR 330 that is driven by the first pre-driver DRVR 330. For example, node NO3 of pre-driver 330-1 is coupled with node NIL1 of pre-driver 330-2, node NO3 of pre-driver 330-2 is coupled with node NIL1 of pre-driver DRVR 330-3, etc. Node NO3 of pre-driver 330-N is coupled with the gate of PMOS transistor P230 of post driver PDRVR 220. Similarly, node NO1 of pre-driver 330-1 is coupled with node NIL2 of pre-driver 330-2, node NO1 of pre-driver 330-2 is coupled with node NIL2 of pre-driver DRVR 330-3, etc. Node NO1 of pre-driver 330-N is coupled with the gate of NMOS transistor N230 of post driver PDRVR 220.

Each pre-driver DRVR 330 includes circuit elements corresponding to and being configured in the same manner as circuit elements in pre-driver DRVR 130 of FIG. 1. For example, each pre-driver DRVR 330 includes PMOS transistors corresponding to and being configured in the same manner as PMOS transistors P20, P30, P40, and P50 in FIG. 1. Each pre-driver DRVR 330 also includes NMOS transistors corresponding to and being configured in the same manner as NMOS transistors N20, N30, N40, and N50. In some embodiments, not all pre-drivers DRVR 330-1 to DRVR 330-N have the same configuration.

In some embodiments, sizes of transistors in a first pre-driver DRVR 330 are smaller than sizes of corresponding transistors in a second pre-driver DRVR 330 that is driven by the first pre-driver DRVR 330. In some embodiments, sizes of transistors in the second pre-driver DRVR 330 are about twice the sizes of corresponding transistors in the first pre-driver. For example, sizes of transistors in pre-driver DRVR 330-2 are twice the sizes of corresponding transistors in pre-driver DRVR 330-1, sizes of transistors in pre-driver DRVR 330-3 are twice the sizes of corresponding transistors in pre-driver DRVR 330-2, sizes of transistors in pre-driver DRVR 330-3 are twice the sizes of corresponding transistors in pre-driver DRVR 330-2, etc.

In some embodiments, sizes of transistors in post driver PDRVR 220 are larger than sizes of pre-driver 330-N, and are selected based on a load of circuit 300 that is coupled with a node NO30 (not labeled) having voltage VO30. Other sizes of post driver PDRVR 220 are within the scope of various embodiments.

In various embodiments of the present disclosure, each pre-driver 330 provides an additional driving strength to circuit 300. As a result, circuit 300 having more pre-drivers DRVR 330 has a stronger driving strength than another circuit 300 having less pre-drivers DRVR 330. Various embodiments of the present disclosure are advantageous over other approaches because each pre-driver 330 has no or insignificant static current. As a result, as additional pre-drivers 330 are added to circuit 300, no or insignificant static current results in circuit 300. In contrast, pre-drivers in other approaches have a significant static current. As a result, in the other approaches, the plurality of pre-drivers corresponding to pre-drivers DRVR 330 causes a significant static current to the total power consumption of the circuit. Further, compared with the embodiments of the present application, because the pre-drivers according to the other approaches have more significant static current, the number of pre-drivers added in a circuit is more limited.

In some embodiments, a circuit comprises a first capacitive device and a first latch. The first capacitive device includes a first end configured to receive a first input signal and a second end coupled with the first latch. The first latch includes a first transistor and a second transistor that are of a first type. A first terminal of the first transistor and a first terminal of the second transistor are each configured to receive a first voltage value. A second terminal of the first transistor is coupled with a third terminal of the second transistor. A third terminal of the first transistor is coupled with a second terminal of the second transistor and with the second end of the capacitive device, and is configured to provide an output voltage for the first latch.

In some embodiments, a circuit comprises a first capacitive device, a second capacitive device, at least one pre-driver circuit, and a post driver circuit. The first capacitive device is configured to receive an input signal and to generate a first capacitive output signal. The first input signal swings between a first voltage level and a second voltage level higher than the first voltage level. The first capacitive output signal swings between a third voltage level and a fourth voltage level. The third voltage level is substantially the same as the second voltage level, and the fourth voltage level is higher than the third voltage level. The second capacitive device is configured to receive the input signal and to generate a second capacitive output signal. The second capacitive output signal swings between a fifth voltage level and a sixth voltage level. The fifth voltage level is substantially the same as the first voltage level, and the sixth voltage level is substantially the same as the second voltage level. The at least one pre-driver circuit is configured to receive the first capacitive output signal and to generate a first pre-driver output signal. The first pre-driver output signal swings between a seventh voltage level and an eighth voltage level. The seventh voltage level is substantially the same as the third voltage level, and the eighth voltage level is substantially the same as the fourth voltage level. The at least one pre-driver circuit is configured to receive the second capacitive output signal and to generate a second pre-driver output signal. The second pre-driver output signal swings between a ninth voltage level and a tenth voltage level. The ninth voltage level is substantially the same as the first voltage level and the tenth voltage level is substantially the same as the second voltage level. The post driver circuit is configured to receive the first pre-driver output signal and the second pre-driver output signal, and to generate a post-driver output signal. The post-driver output signal swings between an eleventh voltage level and a twelfth voltage level. The eleventh voltage level is substantially the same as the first voltage level and the twelfth voltage level is substantially the same as the sixth voltage level.

In some embodiments, a circuit comprises a first latch having a first transistor of a first type and a second transistor of the first type, a second latch having a first transistor of a second type and a second transistor of the second type, and a first circuit. A first terminal of the first-type first transistor and a first terminal of the first-type second transistor are each configured to receive a first voltage value. A second terminal of the first-type first transistor is coupled with a third terminal of the first-type second transistor and with a second terminal of the first circuit. A third terminal of the first-type first transistor is coupled with a first terminal of the first circuit and with a second terminal of the first-type second transistor, and is configured to generate an output voltage for the first latch. A first terminal of the second-type first transistor and a first terminal of the second-type second transistor are each configured to receive a second voltage value. A second terminal of the second-type first transistor is coupled with a third terminal of the second-type second transistor and with a fourth terminal of the first circuit. A third terminal of the second-type first transistor is coupled with a third terminal of the first circuit and with a second terminal of the second-type second transistor, and is configured to generate an output voltage for the second latch.

A number of embodiments have been described. It will nevertheless be understood that various modifications may be made without departing from the spirit and scope of the disclosure. For example, various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. A low or high logical value of various signals used in the above description is also for illustration. Various embodiments are not limited to a particular logical value when a signal is activated and/or deactivated. Selecting different logical values is within the scope of various embodiments. In various embodiments, a transistor functions as a switch. A switching circuit used in place of a transistor is within the scope of various embodiments. In various embodiments, a source of a transistor can be configured as a drain, and a drain can be configured as a source. Various figures show discrete capacitors for illustration. Equivalent circuitry may be used. For example, a capacitive device, circuitry or network (e.g., a combination of capacitors, capacitive devices, circuitry, etc.) can be used in place of the capacitor.

The above illustrations include exemplary steps, but the steps are not necessarily performed in the order shown. Steps may be added, replaced, changed order, and/or eliminated as appropriate, in accordance with the spirit and scope of disclosed embodiments.

What is claimed is:

1. A circuit comprising:
a first capacitive device;
a first latch;
a second capacitive device;
a second latch; and
a first circuit,
wherein
the first capacitive device includes a first end and a second end;
the first end is configured to receive a first input signal;
the first latch includes a first transistor and a second transistor;
the first transistor and the second transistor are of a first type;
a first terminal of the first transistor and a first terminal of the second transistor are configured to receive a first voltage value;
a second terminal of the first transistor is coupled with a third terminal of the second transistor;
a third terminal of the first transistor is coupled with a second terminal of the second transistor and with the second end of the capacitive device, and is configured to provide an output voltage for the first latch;
the second capacitive device includes a first end and a second end;
the first end of the second capacitive device is configured to receive the first input signal;
the second latch includes a third transistor and a fourth transistor;
the third transistor and the fourth transistor are of a second type different from the first type;
the second end of the second capacitive device is coupled with the second latch; and
the first circuit is coupled between the second end of the first capacitive device and the second end of the second capacitive device.

2. The circuit of claim 1, wherein
the first type is a P-type;
the first input signal swings between a second voltage value and a third voltage value; and
the third voltage value is higher than the second voltage value and is lower than the first voltage value.

3. The circuit of claim 2, wherein
based on the first input signal, the first capacitive device is configured to generate a second input signal at the second end of the first capacitive device; and
the second input signal swings between the third voltage value and the first voltage value.

4. The circuit of claim 1, wherein
the first type is an N-type;
the first input signal swings between a second voltage value and a third voltage value;
the second voltage value is substantially equal to the first voltage value; and
the third voltage value is higher than the second voltage value.

5. The circuit of claim 4, wherein
based on the first input signal, the first capacitive device is configured to generate a second input signal at the second end of the first capacitive device; and
the second input signal swings between the second voltage value and the third voltage value.

6. The circuit of claim 1, wherein
a first terminal of the third transistor and a first terminal of the fourth transistor are configured to receive a second voltage value different from the first voltage value;
a second terminal of the third transistor is coupled with a third terminal of the fourth transistor; and
a third terminal of the third transistor is coupled with a second terminal of the fourth transistor and with the second end of the second capacitive device, and is configured to provide an output voltage for the second latch.

7. The circuit of claim 6, wherein
the first type is P-type;
the second type is N-type;
the first input signal swings between the second voltage value and a third voltage value; and
the third voltage value is higher than the second voltage value and is lower than the first voltage value.

8. The circuit of claim 6, wherein
the first input signal swings between the second voltage value and a third voltage value;
based on the first input signal, the second capacitive device is configured to generate a third input signal at the second end of the second capacitive device; and
the third input signal swings between the second voltage value and the third voltage value.

9. The circuit of claim 6, wherein
the first circuit include a fifth transistor, a sixth transistor, a seventh transistor, and an eighth transistor;
a first terminal of the fifth transistor is coupled with the second end of the first capacitive device;
a second terminal of the fifth transistor, of the sixth transistor, of the seventh transistor, and of the eighth transistor are each configured to receive a bias voltage;
a third terminal of the fifth transistor is coupled with a third terminal of the seventh transistor;
a first terminal of the sixth transistor is coupled with the third terminal of the second transistor;
a third terminal of the sixth transistor is coupled with a third terminal of the eighth transistor, and is configured to provide an output voltage for the first circuit;
a first terminal of the seventh transistor is coupled with the second end of the second capacitive device; and
a first terminal of the eighth transistor is coupled with the third terminal of the fourth transistor.

10. The circuit of claim 6, wherein
the first circuit includes at least one first diode and at least one second diode;
the at least one first diode is coupled between the second end of the first capacitive device and the second end of the second capacitive device; and
the at least one second diode is coupled between the third terminal of the second transistor and the third terminal of the fourth transistor.

11. The circuit of claim 6 further comprising a second circuit, wherein
the second circuit comprises a fifth transistor, a sixth transistor, a seventh transistor, and an eighth transistor;
a first terminal of the fifth transistor is configured to receive the first voltage value;
a second terminal of the fifth transistor is configured to receive the output voltage of the first latch;
a third terminal of the fifth transistor is coupled with a first terminal of the sixth transistor;
a second terminal of the fifth transistor and of the sixth transistor are each configured to receive a second bias voltage;
a third terminal of the sixth transistor and of the seventh transistor are coupled together, and are configured to provide an output voltage for the third circuit;
a first terminal of the seventh transistor is coupled with a third terminal of the eighth transistor;

a first terminal of the eighth transistor is configured to receive the second voltage value; and a second terminal of the eighth transistor is configured to receive the output voltage of the second latch.

12. A circuit comprising:
a first capacitive device;
a second capacitive device;
at least one pre-driver circuit; and
a post driver circuit,
wherein
the first capacitive device is configured to receive an input signal and to generate a first capacitive output signal, wherein the first input signal swings between a first voltage level and a second voltage level higher than the first voltage level, the first capacitive output signal swings between a third voltage level and a fourth voltage level, the third voltage level is higher than the first voltage level, and the fourth voltage level is higher than the third voltage level;
the second capacitive device is configured to receive the input signal and to generate a second capacitive output signal, wherein the second capacitive output signal swings between a fifth voltage level and a sixth voltage level, the fifth voltage level is substantially the same as the first voltage level, and the sixth voltage level is higher than the fifth voltage level;
the at least one pre-driver circuit is configured to receive the first capacitive output signal and to generate a first pre-driver output signal, wherein the first pre-driver output signal swings between a seventh voltage level and an eighth voltage level, the seventh voltage level is substantially the same as the third voltage level and the eighth voltage level is substantially the same as the fourth voltage level;
the at least one pre-driver circuit is configured to receive the second capacitive output signal and to generate a second pre-driver output signal, wherein the second pre-driver output signal swings between a ninth voltage level and a tenth voltage level, the ninth voltage level is substantially the same as the fifth voltage level and the tenth voltage level is substantially the same as the sixth voltage level;
the post driver circuit is configured to receive the first pre-driver output signal and the second pre-driver output signal, and to generate a post-driver output signal, wherein the post-driver output signal swings between an eleventh voltage level and a twelfth voltage level, the eleventh voltage level is substantially the same as the first voltage level and the twelfth voltage level is substantially the same as the fourth voltage level;
a pre-driver circuit of the at least one pre-driver circuit includes a first latch, a first circuit, and a second latch; and
the first circuit is coupled between the first latch and the second latch.

13. The circuit of claim 12, wherein
if the at least one pre-driver circuit has more than one pre-driver circuit, sizes of transistors in a first pre-driver circuit are smaller than sizes of transistors in a second pre-driver circuit; and
the first pre-driver circuit drives the second pre-driver circuit.

14. The circuit of claim 12, wherein
the first latch has a first transistor of a first type and a second transistor of the first type;
the second latch has a first transistor of a second type and a second transistor of the second type;

a first terminal of the first-type first transistor and a first terminal of the first-type second transistor are each configured to receive a first supply voltage value;
a second terminal of the first-type first transistor is coupled with a third terminal of the first-type second transistor, and with a second terminal of the first circuit;
a third terminal of the first-type first transistor is coupled with a first terminal of the first circuit, and with a second terminal of the first-type second transistor, and is configured to generate an output voltage for the first latch;
a first terminal of the second-type first transistor and a first terminal of the second-type second transistor are each configured to receive a second supply voltage value;
a second terminal of the second-type first transistor is coupled with a third terminal of the second-type second transistor, and with a fourth terminal of the first circuit; and
a third terminal of the second-type first transistor is coupled with a third terminal of the first circuit and with a second terminal of the second-type second transistor, and is configured to generate an output voltage for the second latch.

15. The circuit of claim 12, wherein the post driver comprises:
a transistor of the first type, a gate of the transistor of the first type being configured to receive the first pre-driver output signal; and
a transistor of the second type, a gate of the transistor of the second type being configured to receive the second pre-driver output signal.

16. The circuit of claim 15, wherein
the gate of the transistor of the first type of the post driver is electrically coupled to a node of the first capacitive device, the node of the first capacitive device being configured to carry the first capacitive output signal; and
the gate of the transistor of the second type of the post driver is electrically couple to a node of the second capacitive device, the node of the second capacitive device being configured to carry the second capacitive output signal.

17. A circuit comprising:
a first latch having a first transistor of a first type and a second transistor of the first type;
a second latch having a first transistor of a second type and a second transistor of the second type; and
a first circuit,
wherein
a first terminal of the first-type first transistor and a first terminal of the first-type second transistor are each configured to receive a first voltage value;
a second terminal of the first-type first transistor is coupled with a third terminal of the first-type second transistor, and with a second terminal of the first circuit;
a third terminal of the first-type first transistor is coupled with a first terminal of the first circuit, and with a second terminal of the first-type second transistor, and is configured to generate an output voltage for the first latch;
a first terminal of the second-type first transistor and a first terminal of the second-type second transistor are each configured to receive a second voltage value;
a second terminal of the second-type first transistor is coupled with a third terminal of the second-type second transistor, and with a fourth terminal of the first circuit; and a third terminal of the second-type first transistor is coupled with a third terminal of the first circuit and with a second terminal of the second-type second transistor, and is configured to generate an output voltage for the second latch.

18. The circuit of claim 17 further comprising a first capacitive device and a second capacitive device,
wherein
the first capacitive device is coupled with the first terminal of the first circuit; and
the second capacitive device is coupled with the second terminal of the first circuit.

19. The circuit of claim 18, further comprising a third transistor of the first type, a fourth transistor of the first type, a third transistor of the second type, and a fourth transistor of the second type,
wherein
a first terminal of the first-type third transistor is configured to receive the first voltage value;
a second terminal of the first-type third transistor is configured to receive the output voltage of the first latch;
a third terminal of the first-type third transistor is coupled with a first terminal of the first-type fourth transistor;
a second terminal of the first-type fourth transistor and a second terminal of the second-type fourth transistor are each configured to receive a bias voltage;
a third terminal of the first-type fourth transistor is coupled with a third terminal of the second-type fourth transistor;
a first terminal of the second-type fourth transistor is coupled with a third terminal of the second-type third transistor;
a first terminal of the second-type third transistor is configured to receive the second voltage value; and
a second terminal of the second-type third transistor is configured to receive the output voltage of the second latch.

20. The circuit of claim 17, wherein
the first capacitive device and the second capacitive device are each configured to receive an input signal;
the input signal swings between a third voltage value and a fourth voltage value higher than the third voltage value;
the first voltage value is higher than the fourth voltage value; and
the second voltage value is substantially the same as the third voltage value.

* * * * *